United States Patent [19]
Bowers et al.

[11] Patent Number: 6,074,892
[45] Date of Patent: Jun. 13, 2000

[54] SEMICONDUCTOR HETERO-INTERFACE PHOTODETECTOR

[75] Inventors: John E. Bowers, Santa Barbara; Aaron R. Hawkins, Goleta, both of Calif.

[73] Assignee: Ciena Corporation, Linthicum, Md.

[21] Appl. No.: 08/801,456

[22] Filed: Feb. 18, 1997

Related U.S. Application Data

[63] Continuation-in-part of application No. 08/646,103, May 7, 1996, abandoned.

[51] Int. Cl.[7] .................................................. H01L 21/70
[52] U.S. Cl. .............................. 438/57; 438/91; 438/94; 438/455
[58] Field of Search .............................. 438/93, 67, 406, 438/455, 91, 94, 31, 24; 148/DIG. 12, DIG. 135; 257/186, 200, 438, 190, 459, 189

[56] References Cited

U.S. PATENT DOCUMENTS

| | | | |
|---|---|---|---|
| 4,656,494 | 4/1987 | Kobayashi et al. | 257/186 |
| 4,729,963 | 3/1988 | Tabatabaie | 257/186 |
| 4,761,383 | 8/1988 | Matsushima et al. | 438/91 |
| 4,839,706 | 6/1989 | Brennan | 257/186 |
| 4,876,209 | 10/1989 | Forrest | 438/91 |

(List continued on next page.)

FOREIGN PATENT DOCUMENTS

| | | | |
|---|---|---|---|
| 61-144816 | 7/1986 | Japan . | |
| 61-118272 | 8/1986 | Japan . | |
| 61-182272 | 8/1986 | Japan | H01L 31/10 |
| 62-2669 | 1/1987 | Japan . | |
| 2-144974 | 6/1990 | Japan . | |
| 2-189982 | 7/1990 | Japan . | |
| 2-194655 | 8/1990 | Japan . | |
| 3-105986 | of 1991 | Japan . | |
| 3-72680 | 3/1991 | Japan . | |

OTHER PUBLICATIONS

Ackley et al., "$In_{0.53}Ga_{0.47}As/InP$ Floating Guard Ring Avalanche Photodiodes Fabricated by Double Diffusion", *IEEE Photonics Technology Letters*, vol. 2, No. 8, (1990).
Webb et al., "Properties of Avalanche Photodiodes", *RCA Review*, vol. 35, pp. 234–279, (1974).
Emmons, "Avalanche–Photodiode Frequency Response", *Journal of Applied Physics*, 38, No. 9, pp. 3705–3714 (1967).
Capasso, "Physics of Avalanche Photodetectors", *Semiconductos and Semimetals*, vol. 22, pp. 1–172, Academic Press, New York (1985).
Lo et al., "Semiconductor lasers on Si substrates using the technology of bonding by atomic rearrangement" *Appl. Phys. Lett.*, 62, pp. 1038–1040 (1993).
Mori et al., "High–quality InGaAs/InP multi–quantum–well structures on Si fabricated by direct bonding", *Electron. Lett.*, 30, pp. 1008–1009.
Grant, "Electron and Hole Ionization Rates in Epitaxial Silicon at High Electric Fields", *Solid–State Electronics*, 16, pp. 1189–1203 (1973).
Cook, et al., "Electron and hole impact ionization coefficients in InP determined by Photomultiplication measurements", *Appl. Phys. Lett.*, 40, No. 7, pp. 589–591 (1982).
Law et al., "Interband Scattering Effects on Secondary Ionization Coefficients in GaAs", *Solid–State Electronics*, 21, pp. 331–340 (1978).
Pearsall, "Impact ionization rates for electrons and holes in $Ga_{0.47}In_{0.53}As$," *Applied Physics Letters*, 36, pp. 218–220, (1980).

(List continued on next page.)

*Primary Examiner*—Savitri Mulpuri
*Attorney, Agent, or Firm*—Charles Berman; Anthony Orler; David L. Soltz

[57] ABSTRACT

By using wafer fusion, various structures for photodetectors and photodetectors integrated with other electronics can be achieved. The use of silicon as a multiplication region and III–V compounds as an absorption region create photodetectors that are highly efficient and tailored to specific applications. Devices responsive to different regions of the optical spectrum, or that have higher efficiencies are created.

7 Claims, 9 Drawing Sheets

U.S. PATENT DOCUMENTS

| | | | |
|---|---|---|---|
| 4,914,494 | 4/1990 | Webb | 257/186 |
| 4,992,386 | 2/1991 | Furuyama et al. | 438/87 |
| 5,023,685 | 6/1991 | Bethea et al. | 257/21 |
| 5,144,637 | 9/1992 | Koch et al. | 372/50 |
| 5,236,547 | 8/1993 | TakaHashi et al. | 156/628 |
| 5,262,347 | 11/1993 | Sands | 228/208 |
| 5,286,671 | 2/1994 | Kurtz et al. | 437/64 |
| 5,315,128 | 5/1994 | Hunt et al. | 251/21 |
| 5,346,848 | 9/1994 | Grupen-Shemansky et al. | 438/406 |
| 5,356,509 | 10/1994 | Terranova et al. | 117/58 |
| 5,376,580 | 12/1994 | Kish et al. | 438/22 |
| 5,385,632 | 1/1995 | Goossen | 438/25 |
| 5,386,137 | 1/1995 | Dell et al. | 257/458 |
| 5,389,797 | 2/1995 | Bryan et al. | 257/186 |
| 5,393,711 | 2/1995 | Biallas et al. | 437/231 |
| 5,407,856 | 4/1995 | Quenzer et al. | 438/455 |
| 5,452,118 | 9/1995 | Maruska | 359/191 |
| 5,527,732 | 6/1996 | Kasahara et al. | 438/24 |
| 5,573,975 | 11/1996 | Cunningham et al. | 438/29 |
| 5,654,583 | 8/1997 | Okuno et al. | 257/627 |
| 5,767,507 | 7/1998 | Unlu et al. | 250/225 |

OTHER PUBLICATIONS

Smith et al., "Sensitivity of Avalanche Photodetector Receivers for Long–Wavelength Optical Communications," *The Bell System Technical Journal,* 61, No. 10, pp. 2929–2946 (1982).

Campbell, "Heterojunction Photodetectors for Optical Communications", *Heterostructures and Quantum Devices,* pp. 243–271, Academic Press, New York (1994).

Littlejohn et al., "High–field transport in InGaAs and related heterostructures," *Properties of Lattice–Matched and Strained Indium Gallium Arsenide,* pp. 107–116, Inspec, London, (1993).

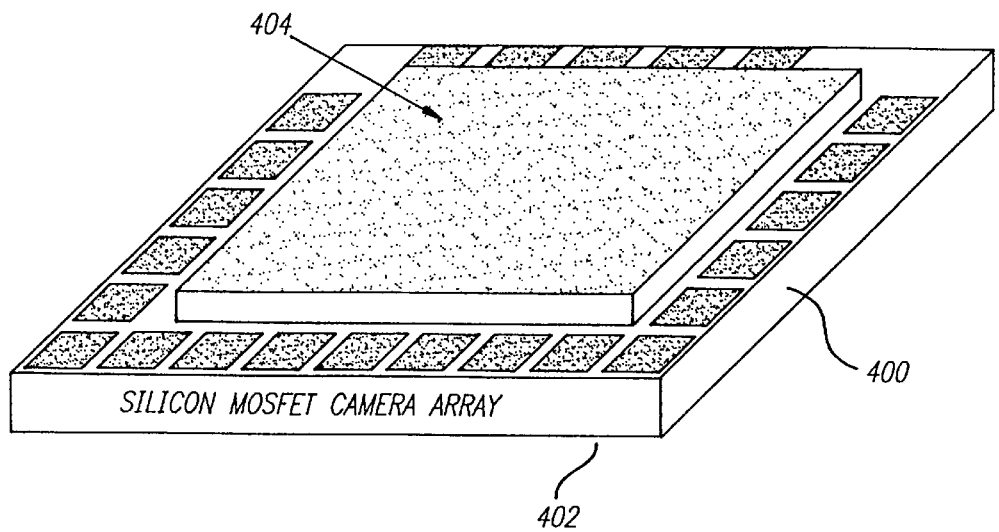
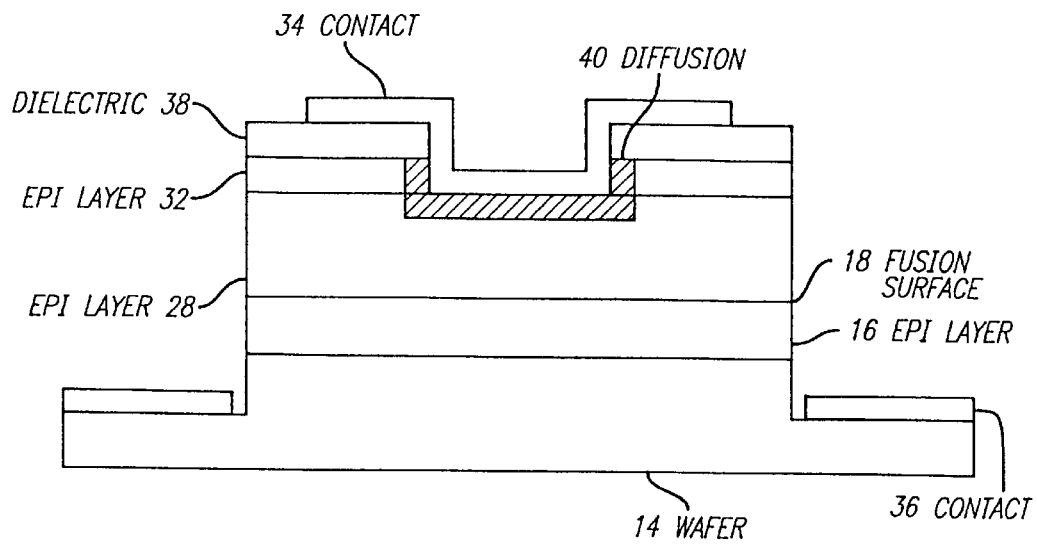

SEMICONDUCTOR HETERO-INTERFACE PHOTODETECTOR

CROSS-REFERENCE TO RELATED APPLICATIONS

This application is a continuation-in-part of Ser. No. 08/646,103 filed on May 7, 1996 by John E. Bowers, et al., entitled "SEMICONDUCTOR HETERO-INTERFACE PHOTODETECTOR" which is now abandoned.

STATEMENT AS TO RIGHTS TO INVENTIONS MADE UNDER FEDERALLY SPONSORED RESEARCH AND DEVELOPMENT

This invention was made with Government support under Grant No. F19628-95-C-0054 awarded by the United States Air Force. The Government has certain rights in this invention.

BACKGROUND OF THE INVENTION

1. Field of the Invention

Having a photodetector that contains a highly efficient multiplication layer, such as silicon, coupled to a highly efficient absorption region, such as indium gallium arsenide, is a large advance in the field of electronics. This invention relates in general to a method of making a semiconductor device. The invention uses silicon as the multiplication region of a photodetector in a number of photodetector structures. Further, the invention integrates photodetectors with other electronic devices to make more complex electronic components and systems.

2. Description of Related Art

The use of semiconductor materials to create various electronic devices is largely dependent on the requirements of the device for a given task, the ability to use certain materials together in a given device, and the cost for the finished device. As device requirements are tightened or increased, new methods and materials combinations are required to meet the requirements for the device.

An avalanche photodetector (APD) has two functions: the absorption and conversion of light to an electrical signal, and the amplification of that electrical signal through avalanche multiplication. These functions can be done by a single material, such as silicon, or by two materials grown epitaxially, one for the absorption and another for the multiplication. The performance of an APD is based on the achievable signal processing speed and noise, which are dependent on the absorption and multiplication efficiencies. These parameters are expressed by the responsivity, the 3-dB frequency bandwidth, and the excess noise factor. The excess noise factor and 3-dB bandwidth are dependent on the total device thickness and the ratio between electron and hole ionization coefficients of the material used for multiplication. The larger the ratio between the electron and hole ionization coefficients, the larger the gain bandwidth product of the APD will be. Further, the larger the coefficient ratio, the less noisy the APD will be.

Current devices that have tried to maximize detector performance have fallen short of desired efficiencies due to the trade off between absorption coefficient and electron/hole ionization coefficients. Materials, such as silicon, that have high electron/hole ionization coefficient ratios do not have good absorption in the desired optical regions, such as the telecommunications wavelengths of 1.3 and 1.5 $\mu$m. Materials that have good absorption do not have a high ionization coefficient ratio. Heterojunction devices have, until now, been limited to lattice matched materials, and device efficiencies have not been significantly increased through the use of heterojunction APDs because of the lattice matching limitation.

It can be seen then that there is a need for a method of making an APD that has high efficiency. It can also be seen that there is a need for a method of making an APD that has a high electron to hole ionization ratio in the multiplication region and a high absorption region for converting light into electricity. It can also be seen that there is a need for a device that can absorb light in the desired optical regions and efficiently and precisely convert that light into electrical signals.

SUMMARY OF THE INVENTION

To minimize the limitations in the prior art described above, and to minimize other limitations that will become apparent upon reading and understanding the present specification, the present invention discloses a powerful and highly productive apparatus and method for making APDs. The present invention is comprehensive and is fully integrable with present fabrication methods.

The present invention solves the above-described problems by providing a method for fusing high ionization ratio materials with high efficiency absorption materials. One material is used as an absorption region for converting light into an electronic signal while another material is used for the amplification region. Silicon is the material of choice for the amplification, or multiplication region, as the properties of silicon are superior for this task. The method is easily performed and is relatively inexpensive. Further, the method provides for customization of semiconductor devices by bandwidth by choosing the absorption material. Since lattice matching is no longer required, the multiplication and absorption regions can be selected separately to optimize the final device.

One object of the present invention is to provide a method for making high efficiency avalanche photodetectors. Another object of the present invention is to provide a avalanche photodetector with a high ionization rate material in contact with a highly efficient absorption material.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of the method and product in accordance with the invention.

BRIEF DESCRIPTION OF THE DRAWINGS

Referring now to the drawings in which like reference numbers represent corresponding parts throughout:

FIG. 9 shows another alternative embodiment of the present invention; and

FIG. 10 shows a planar photodetector structure.

DETAILED DESCRIPTION OF THE INVENTION

Figure 1A:
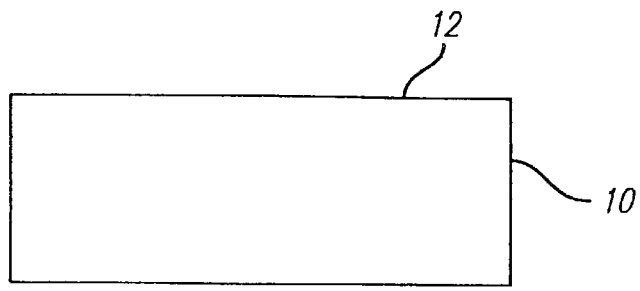
FIGS. 1A–1C are cross-sectional views of the preparation method used for the method and product of the invention.

In the following description of the preferred embodiment, reference is made to the accompanying drawings which form a part hereof, and in which is shown by way of illustration the specific embodiment in which the invention may be practiced. It is to be understood that other embodiments may be utilized and structural and functional changes may be made without departing from the scope of the present invention.

The present invention provides a method for making a heterojunction photodetector that has high efficiency and low dark current response characteristics.

To make a good photodetector, a low noise amplification region is needed. A low noise amplification region will have a high ratio of electron to hole ionization coefficients, which results in low noise amplification. Silicon is such a material, since it has a large (approximately 50:1) ratio of electron to hole ionization coefficients. Indium gallium arsenide (InGaAs) is a poor material for amplification, because the ratio between electron and hole ionization coefficients is approximately 1:1.

Previously, silicon has been fused to InP to monolithically combine InGaAs devices with silicon electronics for purposes of optoelectronic integration. The present invention fuses silicon directly to InGaAs which produces detectors with performance potentials superior to existing III–V APDs in the near-infrared and superior to silicon APDs in the visible.

Silicon is chosen as an APD multiplication region for its large electron to hole ionization coefficient ratio. These coefficients are dependent on the electric field applied to a material, but for example, at 240 kV/cm the electron to hole ratio is 50:1. In most III–V materials this ratio is much lower. For example, in InP at the same field strength the electron to hole ratio is 1:4. Comparing a silicon multiplication region to an InP multiplication region of the same width under a 240 kV/cm electric field, for a multiplication factor of 50, the 3-dB frequency bandwidth is nearly seven times higher in the silicon, and the excess noise factor is nearly five times lower. The increase in bandwidth and reduction in noise is even greater when comparing silicon with other III–V materials used as multiplication regions.

Further, InGaAs APDs have a high dark current (current generated under low or no-light conditions) because InGaAs is a narrow bandgap material. Indium Phosphide (InP) is preferred over InGaAs because InP has a larger bandgap energy than InGaAs. This larger bandgap results in lower dark currents from the avalanche region of the photodetector. InP still does not have the high ratio of electron to hole ionization coefficients, making InP a poor choice for a multiplication region.

Although silicon is an ideal candidate for the amplification (also called multiplication) region, it has an indirect bandgap energy, making silicon a poor absorption material. The absorption coefficient of silicon is approximately 1/100 of InP or InGaAs. If a material has a small absorption coefficient, a thick absorption layer of that material is required for high efficiency, which results in a large transit time and a reduced bandwidth. Further, silicon is limited to near infrared and visible detectors because of silicon's one micron bandgap.

The present invention also has a clear advantage over existing silicon APDs operating in the visible range. InGaAs has an absorption coefficient that is more than an order of magnitude higher than that of silicon at these wavelengths. This allows for a reduction in absorber thickness in the present invention detector compared to silicon APDs using silicon absorption regions. This reduction in thickness gives increased device speed and efficiency as well as lower device operating voltage.

Telecommunications and far infrared applications for detectors operate in bandwidths that exceed the capability of silicon devices. InP and InGaAs devices are able to operate in the 100 GHz range, whereas silicon is typically limited to 1 GHz. While the superiority of silicon as a multiplier is evident, silicon does not absorb in the near-infrared. Most notably, silicon does not absorb at the critical optical communications wavelengths of 1.3 and 1.55 $\mu$m. Until now, epitaxial growth techniques limited infrared APDs to infrared absorbing regions that can be lattice matched to multiplication regions, such as an InGaAs absorber and an InP multiplication region. Silicon was not a feasible choice as a multiplier due to its large lattice mismatch with known infrared absorbing layers, such as InGaAs. The present invention overcomes this limitation by using wafer fusion or other bonding techniques to integrate an InGaAs absorption region with silicon despite the large lattice mismatch of the two materials. The present invention outperforms the speed and noise characteristics of known combinations of III–V materials when operating in the near-infrared.

The fusion process of the present invention allows silicon to be fused or otherwise bonded to InGaAs or InP detectors, allowing each material to perform part of the photodetection process. The InP or InGaAs portion performs the absorption and conversion process, and the electron output of the absorption region is injected into the multiplication region, where the multiplication is performed by the silicon. This results in devices that have low noise current and can operate in high frequency applications.

Other materials may be used for either region depending on the desired application for the finished device.

Figure 1B:
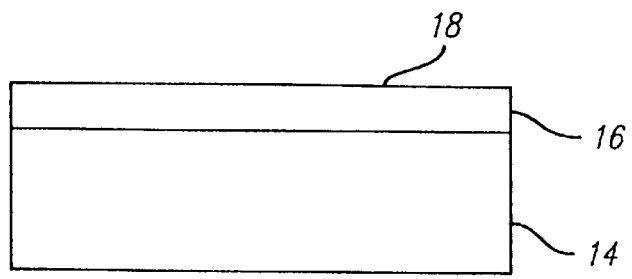
Figure 1C:
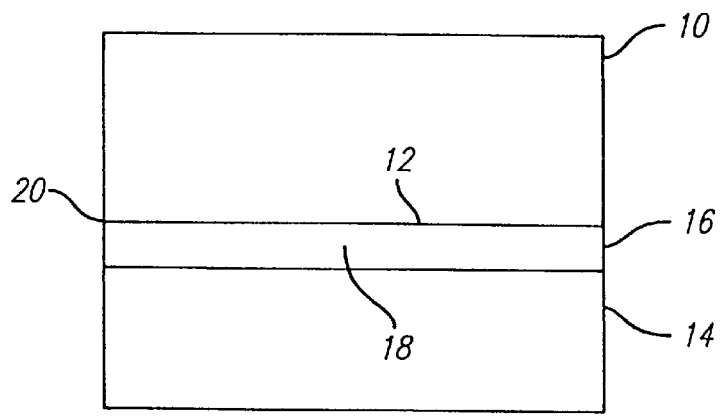

FIGS. 1A–1C are cross-sectional views of the preparation method used for the method and product of the invention. FIG. 1A shows a wafer 10 with top surface 12. The wafer 10 can be made of indium gallium arsenide ($In_xGa_{1-x}As$), but can be other materials, such as indium arsenide (InAs), indium antimonide (InSb), indium gallium arsenide antimonide ($In_xGa_{1-x}As_ySb_{1-y}$), mercury cadmium telluride ($Hg_xCd_{1-x}Te$), indium phosphide (InP), gallium nitride (GaN), aluminum gallium nitride ($Al_xGa_{1-x}N$), indium gallium nitride ($In_xGa_{1-x}N$), indium arsenide phosphide ($InAs_yP_{1-y}$), indium phosphide arsenide ($InP_yAs_{1-y}$), indium gallium arsenide phosphide ($In_xGa_{1-x}As_yP_{1-y}$) indium gallium aluminum arsenide ($In_xGa_yAl_{1-x-y}As$), lead tin telluride ($Pb_xSn_{1-x}Te$), aluminum arsenide (AlAs), aluminum antimonide (AlSb), zinc selenide (ZnSe), zinc telluride (ZnTe), boron nitride (BN), gallium phosphide (GaP), gallium arsenide (GaAs), gallium antimonide (GaSb), gallium aluminum arsenide ($Ga_xAl_{1-x}As$), gallium arsenide phosphide ($GaAs_yP_{1-y}$), gallium indium phosphide ($Ga_xIn_{1-x}P$), gallium indium antimonide ($Ga_xIn_{1-x}Sb$), or other ternary and quaternary materials. The subscripts x, y, 1−x, and 1−y denote the relative amounts of the atomic species in each ternary or quaternary materials and range from zero to one, inclusive.

FIG. 1B shows a second wafer 14. Second wafer 14 can have an epitaxial layer 16 grown on second wafer 14, but the epitaxial layer 16 is not required to practice the present invention. The epitaxial layer 16 can be of a different material than the second wafer 14, or the epitaxial layer 16 can be of the same material as the second wafer 14. The second wafer 14 is typically silicon, but can be other materials, such as Germanium. Epitaxial layer 16 has a fusion surface 18, opposite to where epitaxial layer 16 contacts second wafer 14.

FIG. 1C shows the wafer 10 physically in contact with second wafer 14. The top surface 12 and the fusion surface 16 are brought into close physical contact. Once this physical connection is made, and the wafer 10 and the second wafer 14 are properly aligned, heat is applied to the combination to fuse or bond the wafer 10 and the second wafer 14 together, whereby the top surface 12 and the fusion surface 18 are fused or bonded together.

The fusion process normally requires placing wafer 10 and second wafer 14 in an autoclave clamping the two wafers together, and raising the temperature to approximately 650 degrees Centigrade for silicon and indium gallium arsenide, but may be higher or lower for other materials. The pressure between wafer 10 and second wafer 14 is typically 0.3 gigapascals (GPa), but can be higher or lower depending on the materials. The temperature is raised for approximately thirty minutes, but may be longer or shorter depending on the materials involved. Other methods of bonding the wafers together may be used. The junction created by the physical connection between the wafer 10 and the second wafer 14 is the fusion junction 20.

The use of wafer fusion allows the lattice geometry of the wafer 10 and the lattice geometry of the second wafer 14 to be mismatched. Previously, epitaxial growth of layers on the wafer 10 required that the material to be grown on the top surface 12 have the same lattice constant as the material used in the wafer 10.

By using wafer fusion, lattice matching, described as the distance between the atomic nuclei in a crystalline structure, is no longer required. Further, the lattice geometry, such as face centered cubic, body centered cubic, etc. does not have to match between the materials. As a consequence, materials that have desired properties for different functions within a device, such as essentially the absorption and essentially the multiplication or amplification functions of a photodetector, can now be used in their desired application, and then fused to another material that performs the remainder of the functions required by the device in a more efficient fashion.

As an example, silicon is an excellent multiplier or amplifier, but a poor absorber in the infrared. InGaAs is an excellent infrared absorber, but a poor multiplier or amplifier. By using silicon for the multiplier, and InGaAs for the absorber, and then fusing the two portions of the detector into one unit, the end product is a better device than either material could have produced alone using other fabrication techniques.

Further, the use of wafer fusion allows even more tailoring of devices than currently available. Devices that require higher or lower multiplication or amplification, or very narrow bandwidth absorption regions, can now be made efficiently and for lower cost. Without wafer fusion, devices are limited to either lattice matched interfaces or very thin absorbing layers that are less than the critical strain limit, reducing the possibilities for the types of materials that can be used for the different functions within each device.

Figure 2:
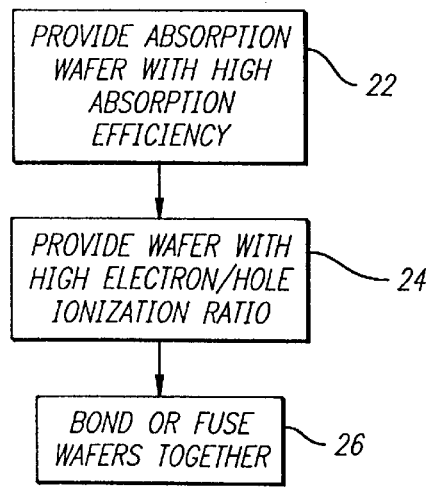
FIG. 2 is a flow chart describing the steps performed in the method of the invention.

FIG. 2 is a flow chart describing the steps performed in the method of the invention. Block 22 represents the step of providing an absorption wafer with high absorption efficiency. Block 22 can be used to provide a wafer with a first desired property, such as high dielectric constant, low bandgap energy, direct bandgap energy, etc. Block 24 shows providing a second wafer with a high electron/hole ionization ratio. Block 24 can be used to provide a wafer with a second desired property, such as high conductivity, indirect band gap energy, etc. Block 26 shows bonding or fusing the wafers together.

Figure 3A:
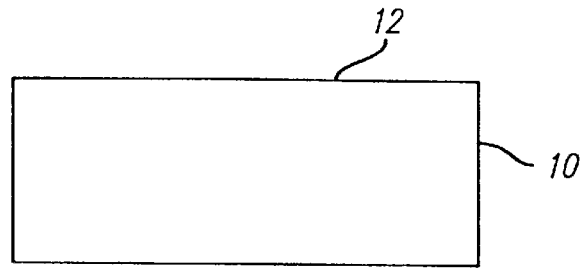
FIGS. 3A–3L are cross-sectional views of an alternative preparation method used for the method and product of the invention.
Figure 3B:
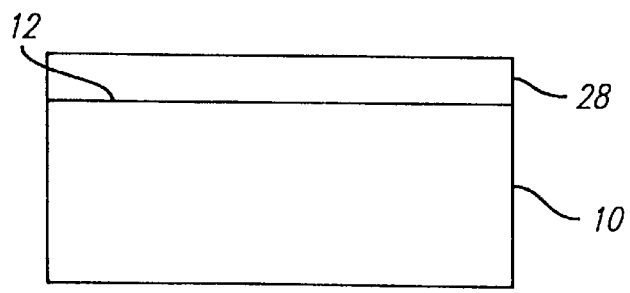

FIGS. 3A–3L are cross-sectional views of an alternative preparation method used for the method and product of the invention. FIG. 3A shows a wafer 10 with top surface 12. The wafer 10 is typically InP, but can be other materials. FIG. 3B shows an epitaxial layer 28 grown on top surface 12 of wafer 10. Epitaxial layer 28 is typically undoped $In_{0.53}Ga_{0.47}As$, but can be other materials as described in relation to FIG. 1A. Epitaxial layer 28 is typically 1.0 to 2.0 µm thick, but can be thicker or thinner.

Figure 3C:
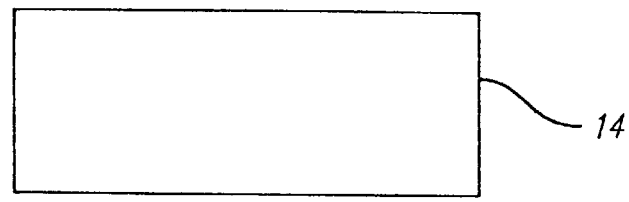
Figure 3D:
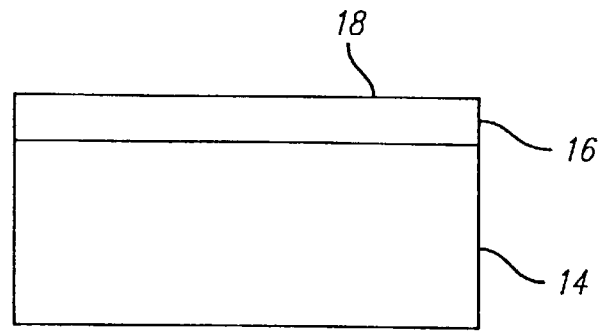

FIG. 3C shows a second wafer 14. Wafer 14 is typically silicon, but can be other materials. FIG. 3D shows epitaxial layer 16 grown on second wafer 14. The epitaxial layer 16 is typically n-doped silicon, but can be other materials. Epitaxial layer 16 is typically 0.5 to 2.5 µm thick, but can be thicker or thinner. Epitaxial layer 16 has a fusion surface 18.

Figure 3E:
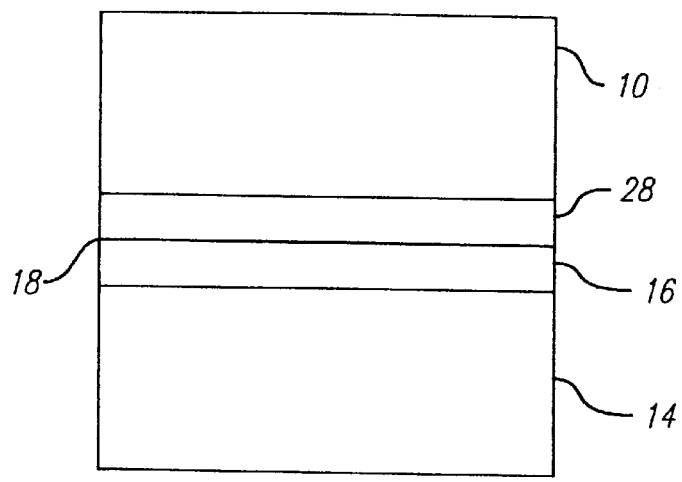

FIG. 3E shows epitaxial layer 28 physically in contact with fusion surface 18 of epitaxial layer 16. The epitaxial layer 28 is then fused to epitaxial layer 16.

Figure 3F:
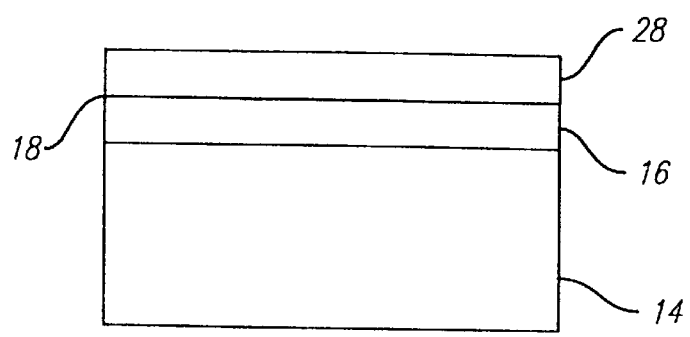
Figure 3G:
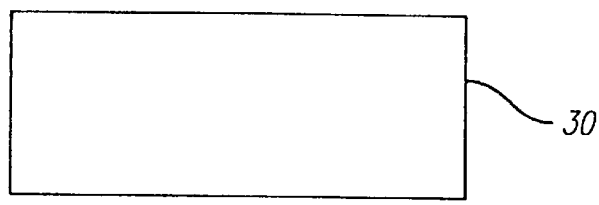
Figure 3H:
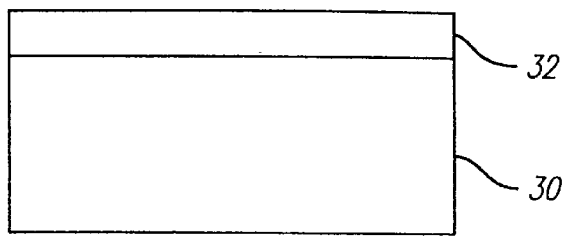

FIG. 3F shows exposing epitaxial layer 28 by removing wafer 10. FIG. 3G shows third wafer 30. Third wafer 30 is typically InP, but can be other materials. FIG. 3H shows growing epitaxial layer 32 on third wafer 30. Epitaxial layer 32 is typically p+ doped $In_{0.53}Ga_{0.47}As$, but can be other materials as described in relation to FIG. 1A.

Figure 3I:
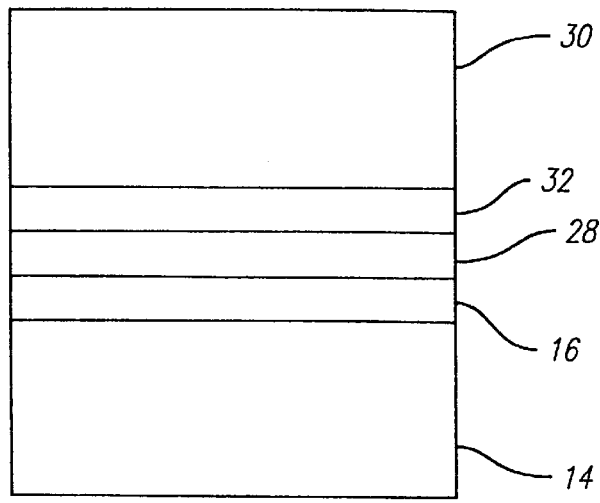

FIG. 3I shows epitaxial layer 32 in contact with epitaxial layer 28. Epitaxial layer 32 is fused to epitaxial layer 28. The second fusion of epitaxial layer 32 to epitaxial layer 28 is to minimize the diffusion of p-type dopants from the epitaxial layer 32 to the epitaxial layer 28 during the growth of the epitaxial layer 32.

Figure 3J:
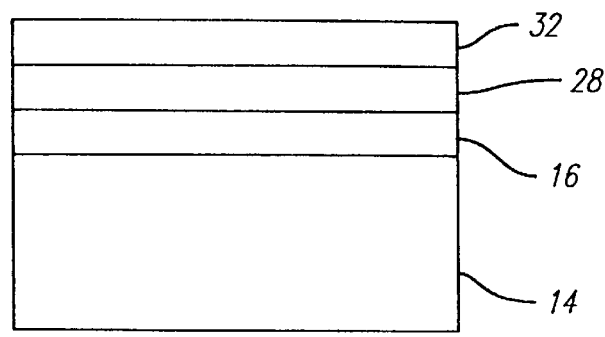
Figure 3K:
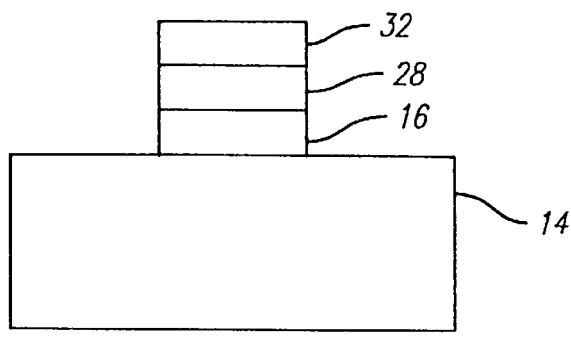

FIG. 3J shows exposing epitaxial layer 32 by removing third wafer 30. FIG. 3K shows etching epitaxial layer 32, epitaxial layer 28, and epitaxial layer 16. The etching is done to provide device isolation between individual APDs.

Figure 3L:
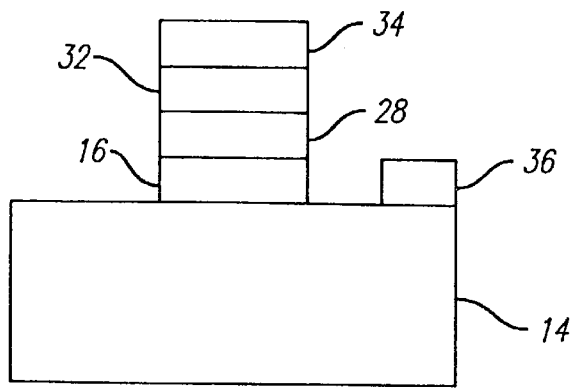

FIG. 3L shows adding contact 34 to epitaxial layer 32 and contact 36 to wafer 14. Contact 34 and contact 36 can be the same material, or different materials. Contact 34 is typically a gold/zinc blend, and contact 36 is typically gold. Additional materials, such as dielectric materials, can be added to provide further device isolation.

Fabrication and Testing Results

Avalanche photodetectors were constructed by two different methods, one using a single fusion step and another using two separate fusion steps. In the single fusion method, a molecular beam epitaxy (MBE) grown $In_{0.53}Ga_{0.47}As$/InP wafer (crystal orientation (100)) was fused to an epitaxial silicon layer grown on a silicon substrate (crystal orientation (100)) with a shallow p-type ion implant at its surface. The epitaxial $In_{0.53}Ga_{0.47}As$ layers consisted of a 0.2 µm thick p+ layer and a 2.0 µm thick intrinsic layer. After the fusion step the InP substrate was removed.

In the two step fusion method, first a 1.0 μm thick metal-organic chemical vapor deposition (MOCVD) grown intrinsic $In_{0.53}Ga_{0.47}As$ layer on an InP substrate (crystal orientation (100)) was fused to an intrinsic epitaxial Si layer grown on an n+ substrate (crystal orientation (100)) with a shallow p-type ion implant at its surface. After the first fusion step, the InP substrate was selectively removed leaving only the InGaAs epitaxial layer. A second 0.2 μm MOCVD grown p+ doped $In_{0.53}Ga_{0.47}As$ layer on an InP substrate was then fused to the first InGaAs layer and the InP substrate subsequently removed. Fusion steps were done by placing the epitaxial layers in direct contact under pressure at temperatures of 650° C. for 20 minutes in an $H_2$ atmosphere. TEM scans of the fused junction between InGaAs and Si show covalent bonding between the materials. Also visible are edge dislocations that remain at the interface and do not thread up into the epitaxial layers. The two fusion step process was used to avoid diffusion of p-type dopants from the p+ InGaAs layer into the intrinsic InGaAs layer during MOCVD growth. Some dopant diffusion is unavoidable when the intrinsic layer is grown directly over the p+ layer.

The epitaxial layers of the finished device for both the single and two fusion step processes are as follows, starting from the topmost layer. First, a 0.2 μm thick $In_{0.53}Ga_{0.47}As$ p+ layer with a doping level of $2\times10^{19}$ $cm^{-3}$ is used for ohmic metal contact. The second region is a 1.0 μm or 2.0 μm thick intrinsic $In_{0.53}Ga_{0.47}As$ layer unintentionally doped n-type used for photon absorption. This layer was fused to a Si surface implanted with a shallow 10 keV, $1.3\times10^{12}$ $cm^{-2}$ dose of boron atoms (p-type). Below this implant was a 2.5 μm intrinsic epitaxial Si layer, unintentionally doped n-type with a doping level of approximately $5\times10^{14}$ $cm^{-3}$. This layer serves as the multiplication region for the detector and was grown on an n+ substrate with a doping level of $1\times10^{18}$ $cm^{-3}$. The implantation dose in the Si was calculated to ensure that the electric field in the intrinsic Si region is higher than that in the intrinsic InGaAs region when the device is biased at operating voltages. For significant avalanche gain in the multiplication region, electric fields of 240 kV/cm to 300 kV/cm will be present, while the field in the InGaAs will remain below 100 kV/cm. Fields of this strength in the InGaAs layer allow for electron velocities of over $7\times10^6$ cm/sec through the region but inhibit avalanche multiplication.

After the fusion and InP substrate removal steps, further fabrication steps proceeded as follows. First the epitaxial InGaAs and Si layers were etched through leaving only circular mesas of variable diameter to provide device isolation. A reactive ion etcher (RIE) using a mixture of methane-hydrogen-argon gas was used for etching InGaAs and an RIE using $Cl_2$ was used for etching Si. A top metal layer of AuZn/Ni served as an etch mask for the devices as well as a top p-type contact. Dielectric layers and n-type metal contacts were also added to allow for probing.

Results

Amplification region: Silicon, unintentionally doped to $5\times10^{14}$ $cm^{-3}$ Absorption region: indium gallium arsenide, $In_{0.53}Ga_{0.47}As$ Fusion conditions: 650° C., 20 minutes Illumination: 1.3 and 1.55 μm wavelength lasers, backlighting the detector through the silicon wafer. The expected response of the detector is only between 1.0 and 1.65 μm.

Upon illumination with 1.3 and 1.55 μm lasers, dark current versus reverse bias and photocurrent versus reverse bias curves exhibited expected characteristics. Measurements indicated a large initial increase in the photocurrent and dark current for a small increase in the reverse bias, then a relatively flat region where the InGaAs absorption layer and p-type ion implant in the Si are being depleted and the gain is approximately one. There is then a visible kink in the response curve with the onset of avalanche gain. Gains of over 25 were measured for incident light levels of around 20 μW and gains of over 130 were measured for light levels of around 2 μW.

When the illumination wavelength was changed to 920 nanometers, no photocurrent multiplication was observed. Since silicon is not transparent at this wavelength, the light was absorbed in the silicon layer. Hole diffusion to the junction between silicon and InGaAs prevented any photocurrent multiplication.

Frequency response measurements were also made on the detectors using an HP 8703a Lightwave Component Analyzer. For a 23 μm diameter device illuminated with a 1.3 μm laser, at a gain of 10, a 3-dB bandwidth of 13 GHz was measured. At a gain of 35, a 3-dB bandwidth of 9 GHz was measured yielding a gain-bandwidth product of 315 GHz. This measured gain bandwidth product is over twice as high as any previously reported telecommunications avalanche photodetector.

Resonant Cavity APDs

Figure 4A:
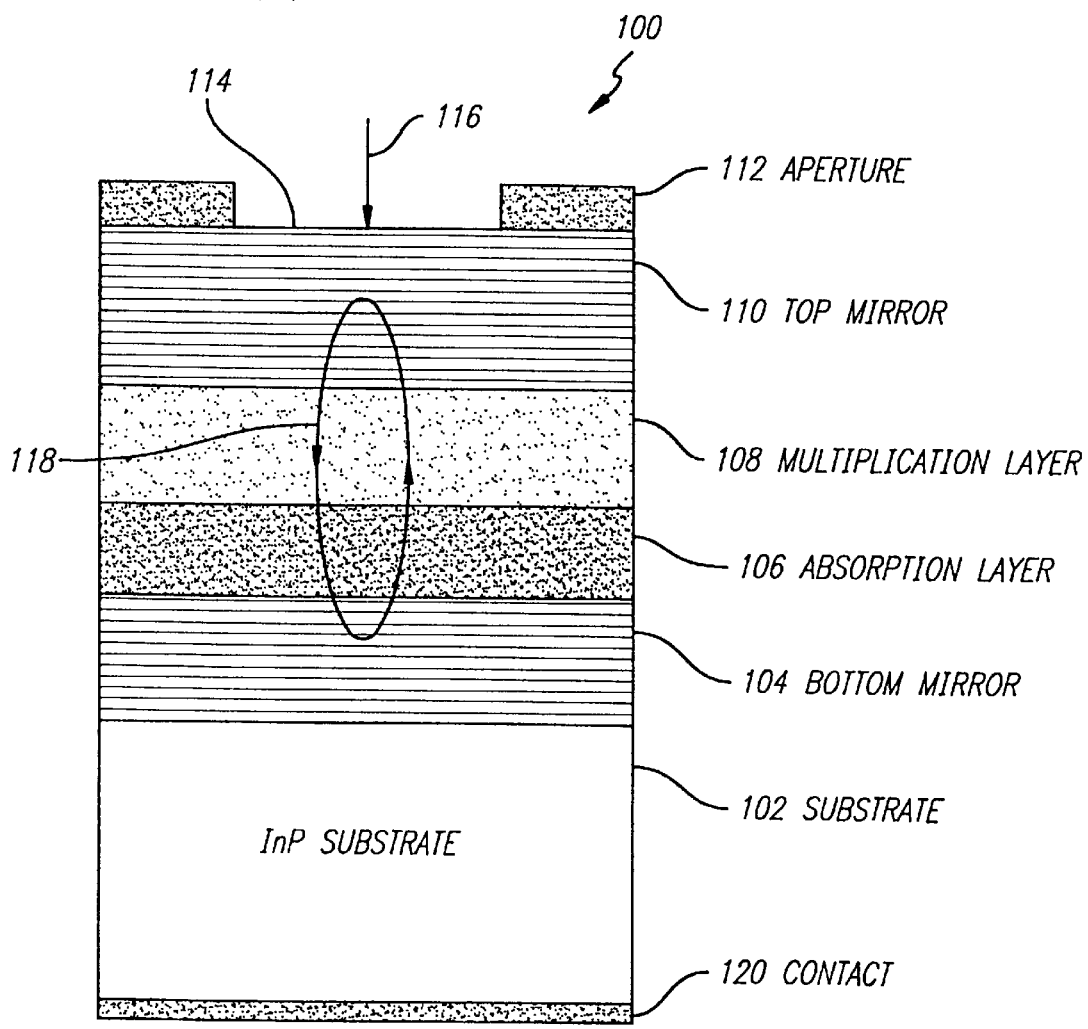
FIGS. 4A–4B show embodiments of a resonant cavity photodetector of the present invention.
Figure 4B:
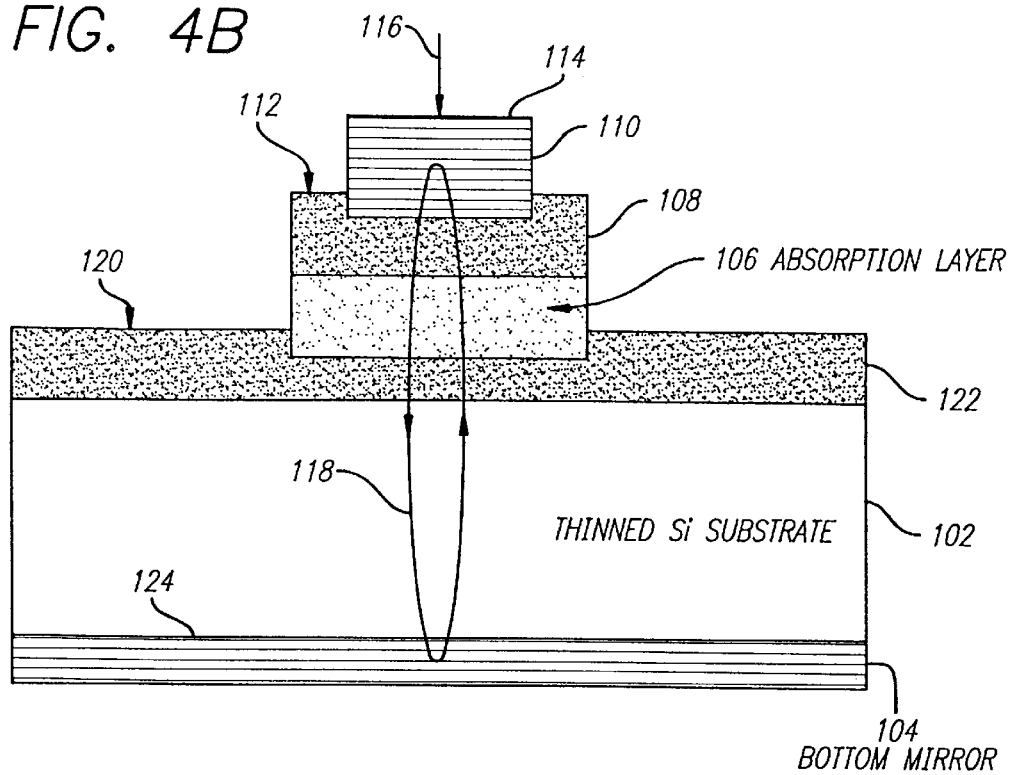

FIGS. 4A–4B show embodiments of a resonant cavity photodetector of the present invention.

FIG. 4A shows a resonant cavity photodetector 100 structure of the present invention. Substrate 102 supports bottom mirror 104. Substrate 102 can be indium phosphide (InP), but can also be other materials. Bottom mirror 104 can be an indium gallium arsenide/indium phosphide (InGaAs/InP) dielectric mirror, but can also be constructed of other materials. Bottom mirror 104 is typically a quarter wave stack, but can also be other mirror constructions. Bottom mirror 104 is typically grown or deposited, but can also be fused or otherwise attached to the substrate 102.

Absorption layer 106 is attached to bottom mirror 104. Absorption layer 106 is typically InGaAs, but can be other materials. Absorption layer 106 is typically grown or deposited on bottom mirror 104, but can also be fused or otherwise attached to bottom mirror 104.

Multiplication layer 108 is attached to absorption layer 104. Multiplication layer 108 is typically silicon, but can be germanium, gallium arsenide, indium phosphide, or other materials. Multiplication layer 108 is typically fused to absorption layer 106. Multiplication layer 108 is typically a silicon substrate that has been thinned by implanting an SiO2 layer and etching down to this layer.

Top mirror 110 is attached to multiplication layer 108. Top mirror 110 is typically grown or deposited on multiplication layer 108, but can be fused or otherwise attached. Top mirror 110 is typically a quarter wave stack, but can be other mirror constructs. Top mirror 110 can be a silicon oxide/titanium oxide ($SiO_2/TiO_2$) dielectric mirror, but can also be made of other materials.

Aperture 112 restricts the area of top mirror 110 that is exposed to incident light. Aperture 112 is typically made of material that is opaque to the frequency of light that is expected to reach the outside surface 114 of top mirror 110.

Light 116 is injected into the detector 100 at the top surface 114 of top mirror 110. The light 116 enters the multiplication layer 108 and then the absorption layer 106. The light reflects off the bottom mirror 104, and returns through the absorption layer 106 and multiplication layer 108, and reflects off top mirror 110, shown as path 118.

Aperture 112 acts as the mechanism to remove photogenerated electrons from the multiplication layer 108.

The advantage of the structure of FIG. 4A is that the absorption layer 106 can be very thin and still have high quantum efficiency, since the absorption layer 106 has multiple "attempts" to absorb the light since path 118 passes the light 116 through the absorption layer 106 multiple times. The thin absorption layer 106 results in a higher speed detector 100.

FIG. 4B shows an alternative embodiment of the resonant cavity photodetector 100 structure of the present invention. In FIG. 4B, the substrate 102 is silicon. An n+ region 122 is grown, implanted, or diffused into substrate 104. The n+region 122 is used for good ohmic contact with the contact 120.

Multiplication layer 106 is grown on the n+ region 122, and absorption layer 108 is fused to multiplication layer 106. Top mirror 110 is then grown, deposited, or otherwise attached to absorption layer 108.

The substrate 102 is thinned using selective wet or dry etching techniques, and bottom mirror 104 is deposited, grown, or otherwise attached to the bottom 124 of substrate 102. Alternatively, the bottom mirror 104 can be grown below the silicon multiplication layer 106 using typical growth techniques.

Light 116 strikes top surface 114 of top mirror 110 and again creates path 118 for the light within the resonant cavity of the photodetector.

Waveguide APD Structures

Figure 5:
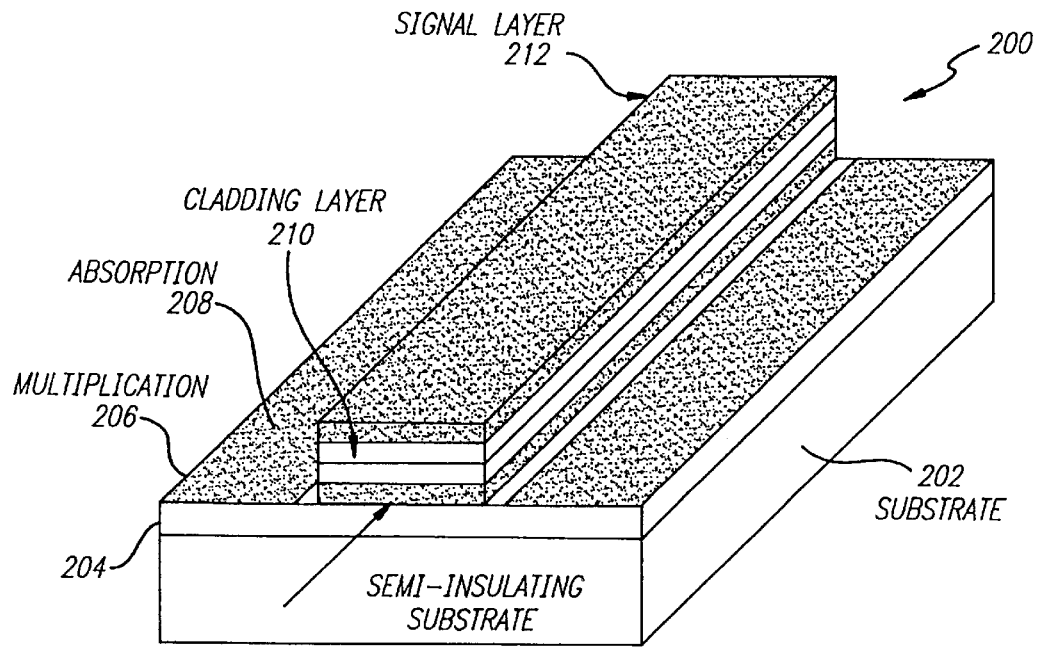
FIG. 5 shows a waveguide APD structure of the present invention.

FIG. 5 shows a waveguide APD 200 structure of the present invention.

Substrate 202 supports a doped layer 204 as the base for the waveguide APD 200. Substrate 202 is typically an intrinsic silicon, but can be other materials.

Doped layer 204 is typically n+ silicon, but can be other materials. Multiplication layer 206 is grown, deposited, or otherwise attached to doped layer 204. Multiplication layer 206 is typically silicon, but can be other materials.

Absorption layer 208 is attached to multiplication layer 206. Absorption layer 208 is fused to multiplication layer 206. Absorption layer is typically InGaAs, but can be other materials.

Absorption layer 208 can also be a quantum wire layer, a quantum well layer, or a strained quantum layer, depending on the desired device 200 construction. These layers are described in Bowers and Wey, "High Speed Photodetectors," Chapter 17 of *Handbook of Optics*, Optical Society of America, McGraw-Hill, 1994, which is hereby incorporated by reference.

Cladding layer 210 is attached to absorption layer 208. Cladding layer 210 is typically a p-cladding layer, but may be other materials. Signal layer 212 is the electrical contact for waveguide APD 200. Signal layer 212 is typically metal, but can be other materials.

Another waveguide APD 200 can be made with the structure shown in FIG. 5. The alternative waveguide APD is a transmission line with a particular impedance, typically fifty ohms, and a velocity matched to the optical mode.

Signal layer 212 is attached to cladding layer 210, and is the signal line for an electromagnetic signal to travel on. Since signal layer 212 and cladding layer 210 are traveling along the optical and microwave waveguides together, there is no capacitance limit to the waveguide APD 200.

Figure 6:
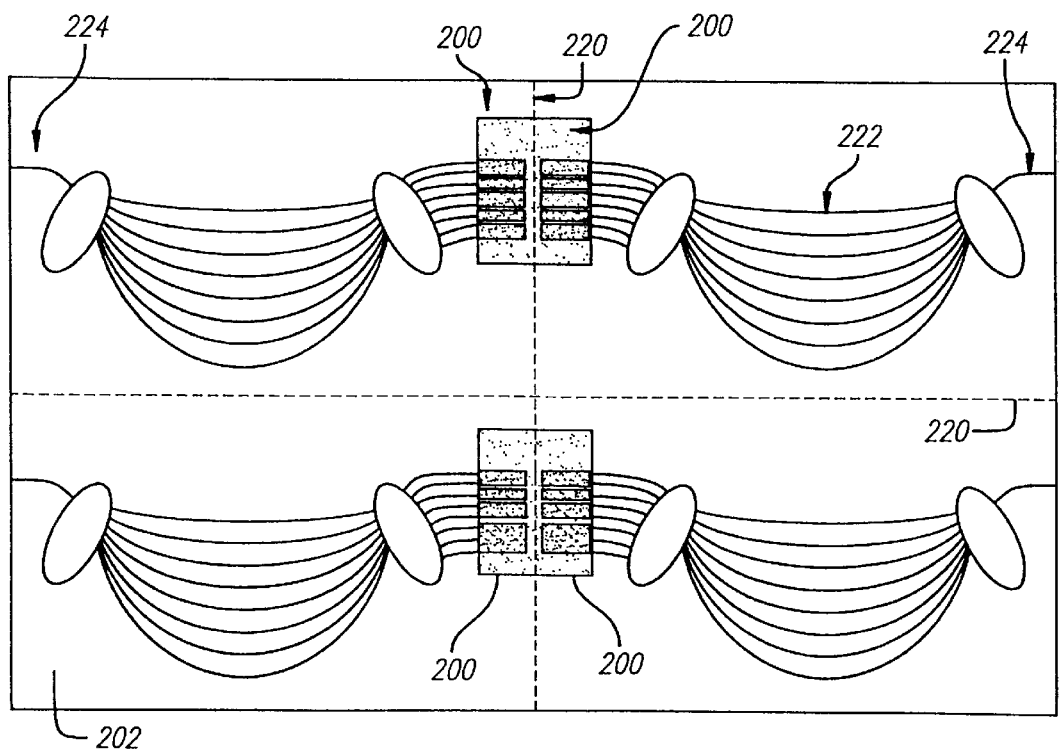
FIG. 6 shows the waveguide APD structure of the present invention integrated with other structures on a substrate.

FIG. 6 shows the waveguide APD 200 structure of the present invention integrated with other structures on the substrate 202.

FIG. 6 shows four devices using the waveguide APD 200 of the present invention. Saw lines 220 show that there are four end devices that will result from the structure depicted.

Device 222 is an optical waveguide component known as a Dragone Filter. The input 224 to device 222 allows for an optical or electrical input to the device 222. Other optical components can be fabricated on substrate 202, such as wavelength dependent signal splitters, combiners, or other optical benchtop devices and components. These devices 222 can also be connected to waveguide APD 200.

Figure 7:
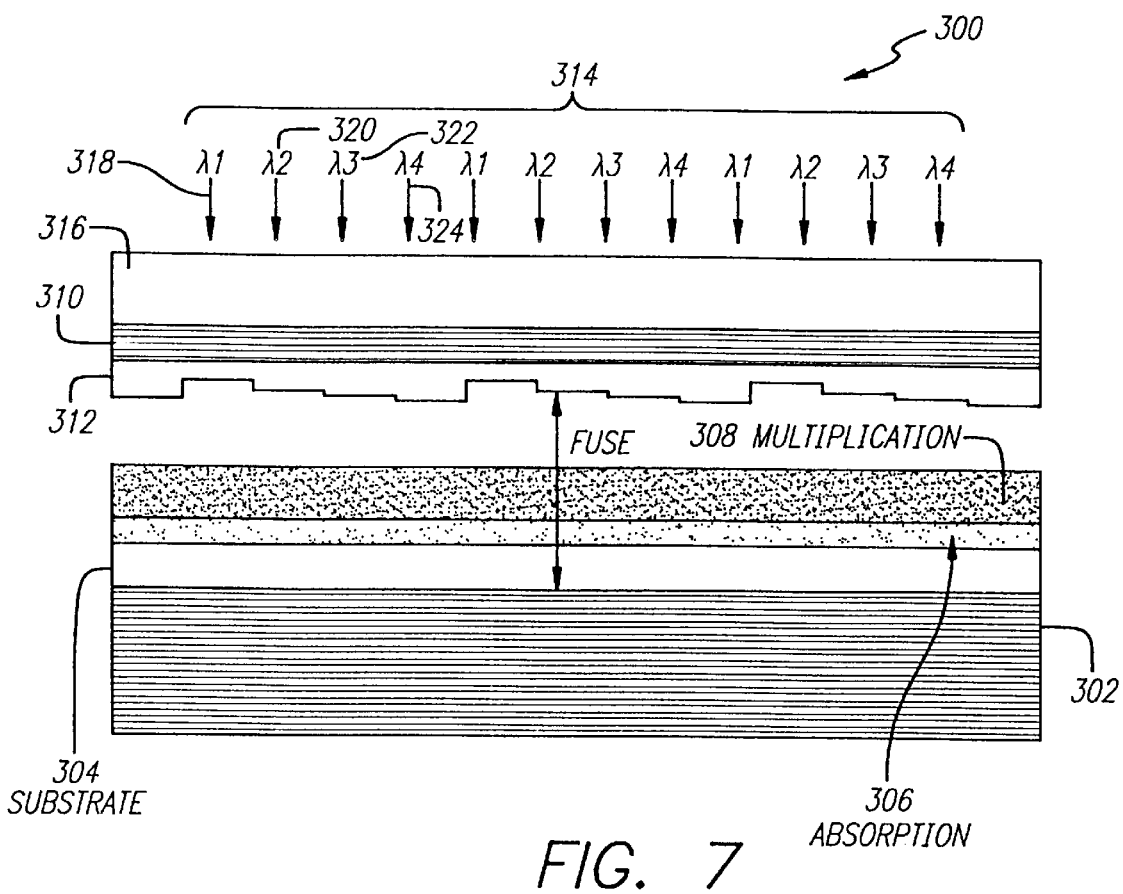
FIG. 7 shows a wavelength division multiplexing (WDM) APD of the present invention.

FIG. 7 shows a wavelength division multiplexing (WDM) APD 300 of the present invention.

Bottom mirror 302 is attached to substrate 304. Absorption layer 306 is then grown, deposited, or otherwise attached to substrate 304.

A second wafer is used for the multiplication layer 308. Multiplication layer 308 is typically silicon, but can be other materials. Multiplication layer 308 is then fused to absorption layer 306. Multiplication layer 308 can be thinned prior to fusing, or thinned after the fusing step has taken place.

A third wafer is used for the top mirror 310 and cavity length layer 312. Cavity length layer 312 is structured to provide a resonant cavity for a given wavelength of light that will be incident on that portion of the WDM APD 300. Cavity length layer 312 can be embedded in or part of top mirror 310, absorption layer 306, multiplication layer 308, or bottom mirror 302, or can be a separate layer as shown. Top mirror 310 is typically a quarter wave stack of gallium arsenide and aluminum gallium arsenide, but can be other materials.

Cavity length layer 312 is then fused to multiplication layer 308. Light 314 is incident on top surface 316. Light 314 has several different wavelength components, λ1 318, λ2 320, λ3 322, and λ4 324. Light 314 can have more wavelength components, and WDM APD 300 can be responsive to more than four components or fewer than four components of light 314. The length of cavity length layer 312 determines which component of light 314 that portion of the WDM APD 300 is responsive to.

Figure 8:
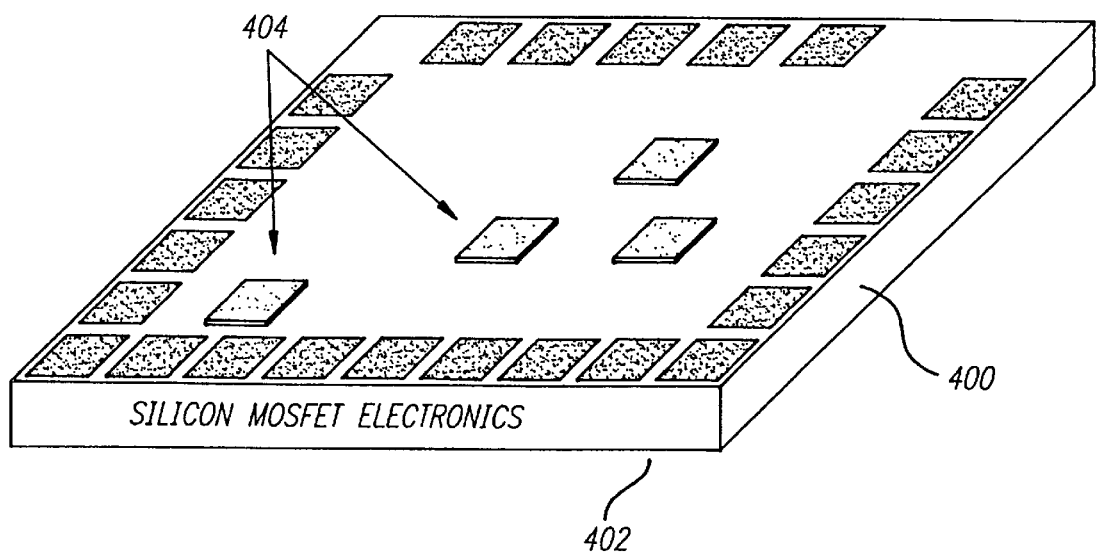
FIG. 8 shows an alternative embodiment of the present invention.

FIG. 8 shows an alternative embodiment of the present invention. Substrate 400 contains electronics, doped regions, or other electrical devices 402, which can be constructed on substrate 400 or on another substrate altogether. Further, absorption areas 404 are fused to substrate 400. This allows the photodetector created by the fusion of absorption areas 404 to be electrically connected to other electronic devices 402 on a single wafer.

Electrical devices 402 can be any electrical device that can be made on the wafer. Further, absorption areas 404 can be of different types of material, e.g., one of the absorption areas 404 can be InGaAs, and another absorption area can be InSb.

FIG. 9 shows another alternative embodiment of the present invention. In FIG. 9, the substrate is silicon, and electrical constructions 402 are the electronics required for a video camera. Absorption area 404 is an InGaAs detector array, fused to substrate 400. The resulting device is a video camera detector chip.

FIG. 10 shows a planar photodetector structure. As with FIGS. 3A–3L, the structure of FIG. 10 shows a generic photodetector. The dielectric 38 is added between the epitaxial layer 32 and the contact 34.

The diffusion region 40 is added to the structure to reduce the dark current that travels through the device. The diffusion region is typically a zinc diffusion, but can be other materials.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for creating a wavelength division multiplexing (WDM) photodetector, comprising the steps of:

(a)(i) growing a first mirror on a bottom of a substrate;
(ii) growing an absorbing layer having a first lattice constant on the first mirror:
(iii) fusing a multiplication layer having a second lattice constant to a top of the substrate opposite to the first mirror, to form the wavelength division multiplexing photodetector, and thereby to permit a current to effectively pass between the absorbing layer and the multiplication layer;

(b)(i) growing a second mirror on a second substrate;
(ii) growing a cavity length layer on the second mirror;

(c) selectively etching the cavity length layer such that the depth of the cavity length layer has more than one depth along a length of the cavity length layer; and (d) fusing the cavity length layer to the multiplication layer.

2. The method of claim 1, wherein the first mirror is a quarter-wave stack.

3. The method of claim 1, wherein the first mirror includes alternating layers of indium gallium arsenide phosphide and indium phosphide.

4. The method of claim 1, wherein the absorption layer is selected to be at least one material selected from a group consisting of:

InAs, InSb, InP, $In_xGa_{1-x}As$, $InAs_yP_{1-y}$, $InP_yAs_{1-y}$, $In_xGa_{1-x}N$, $In_xGa_{1-x}As_ySb_{1-y}$, $In_xGa_{1-x}As_yP_{1-y}$, $In_xGa_yAl_{1-x-y}As$, $Pb_xSn_{1-x}Te$, AlSb, AlAs, $Al_xGa_{1-x}N$, ZnSe, ZnTe, BN, GaP, GaAs, GaSb, $Ga_xAl_{1-x}As$, $GaAs_yP_{1-y}$, $Ga_xIn_{1-x}P$, $Ga_xIn_{1-x}Sb$, and $Hg_xCd_{1-x}Te$, wherein x and y vary from zero to one inclusive.

5. The method of claim 1, wherein the multiplication layer is selected to be at least one of a group consisting of:

Si, and Ge.

6. The method of claim 1, wherein the second mirror is a quarter-wave stack.

7. The method of claim 6, wherein the second mirror is selected to be comprised of alternating layers of at least one of a group comprising:

silicon oxide and titanium oxide, and silicon oxide and silicon nitride.

* * * * *

UNITED STATES PATENT AND TRADEMARK OFFICE
CERTIFICATE OF CORRECTION

PATENT NO. : 6,074,892
DATED : June 13, 2000
INVENTOR(S) : John E. Bowers and Aaron R. Hawkins Page 1 of 1

It is certified that error appears in the above-identified patent and that said Letters Patent is hereby corrected as shown below:

<u>Column 4,</u>
Line 64, after "(BN)," and before "gallium", insert -- germanium (GE), --.

Signed and Sealed this

Seventh Day of May, 2002

Attest:

JAMES E. ROGAN
*Attesting Officer*   *Director of the United States Patent and Trademark Office*